(12) United States Patent
Steinbach (10) Patent No.: US 8,350,741 B2
(45) Date of Patent: Jan. 8, 2013

(54) DEVICE AND METHOD FOR DRIVING DIGITAL-TO-ANALOG CONVERTER

(75) Inventor: Gunter Steinbach, Palo Alto, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 165 days.

(21) Appl. No.: 13/017,130

(22) Filed: Jan. 31, 2011

(65) Prior Publication Data

US 2012/0194373 A1    Aug. 2, 2012

(51) Int. Cl.
*H03M 1/66* (2006.01)
(52) U.S. Cl. ........................................ 341/144; 341/145
(58) Field of Classification Search .................. 341/144, 341/145, 150, 141, 154; 327/535, 540, 541, 327/105; 345/76, 77, 87, 98, 100, 204
See application file for complete search history.

(56) References Cited

U.S. PATENT DOCUMENTS

2004/0155804 A1* 8/2004 Dedic ........................... 341/144

* cited by examiner

*Primary Examiner* — Joseph Lauture (57) ABSTRACT

A device for driving a switch in a digital-to-analog converter (DAC) includes first and second latches, and a logic gate. The first latch is configured to store a digital input data signal according to a clock signal, and to output a first latch signal corresponding to the stored digital input data signal. The second latch is configured to store the first latch signal output by the first latch according to a logical inverse of the clock signal, and to output a second latch signal corresponding to the stored first latch signal. The logic gate is configured to perform an OR logic operation on the first latch signal and the second latch signal, the logic gate outputting a drive signal for driving a switch in the DAC connected to a current source.

20 Claims, 7 Drawing Sheets

DEVICE AND METHOD FOR DRIVING DIGITAL-TO-ANALOG CONVERTER

BACKGROUND

Digital-to-analog converters (DACs) are discrete-time (clocked), discrete-valued systems. Generally, a DAC accepts words of a digital input data signal having a certain width at discrete times, typically at a constant rate referred to as the "clock frequency," and produces a finite set of distinct analog output values. In order to obtain a continuous-valued, smooth waveform, the output values pass through a reconstruction filter. Nearly ideal reconstruction filters may be designed for some special purpose systems. However, for a very high-speed DAC and/or for variable-impedance output loads, the reconstruction filter is typically far from ideal. Thus, the resulting waveform of the output values, while approaching the desired waveform once per update period, has large instantaneous errors, which are generally proportional to the size of the step (difference) between adjacent output values of the DAC.

When the reconstruction filter cannot be improved (i.e., made more ideal), the instantaneous errors may be reduced by updating the DAC more often, resulting in smaller difference steps between adjacent output values, and/or by increasing the resolution of the DAC, resulting in a larger, more finely spaced set of possible output values. However, for a high-speed DAC, these approaches are expensive and difficult, if not impossible, to implement in the context of a given technology, e.g., due to limitations in providing the digital input data signal at a faster rate and in configuring switches to more quickly select or produce the output values.

SUMMARY

In a representative embodiment, a device for driving a switch in a digital-to-analog converter (DAC) includes first and second latches, and a logic gate. The first latch is configured to store a digital input data signal according to a clock signal, and to output a first latch signal corresponding to the stored digital input data signal. The second latch is configured to store the first latch signal output by the first latch according to a logical inverse of the clock signal, and to output a second latch signal corresponding to the stored first latch signal. The logic gate is configured to perform an OR logic operation on the first latch signal and the second latch signal, the logic gate outputting a drive signal for driving a switch in the DAC connected to a current source.

In another representative embodiment, a DAC includes switch drivers configured to receive a digital input data signal and an inverse of the digital input data signal, respectively, and to output a corresponding plurality of drive signals; switches corresponding to the switch drivers and operable in response to the drive signals; and at least one current source selectively connectable to outputs by the switches, respectively, the outputs providing corresponding analog output signals. Each of the switch drivers includes a master latch, a slave latch and a logic gate. The master latch is configured to latch a level of one of the digital input data signal or the inverse of the digital input data signal according to a clock signal, and to output a master latch signal. The slave latch is configured to latch a level of the master latch signal output by the master latch according to an inverse of the clock signal, and to output a slave latch signal. The logic gate is configured to perform an OR logic operation on the master latch signal and the slave latch signal, the logic gate outputting one of the drive signals for driving a corresponding switch of the switches.

In yet another representative embodiment, a method is provided for driving a DAC that receives a digital input data signal and outputs corresponding analog output signal. The DAC includes multiple switch drivers and corresponding switches for selectively connecting at least one current source to at least one output of the DAC, in response to multiple drive signals provided by the switch drivers under control of a clock signal. The method includes activating a first switch to enable the DAC to output a first value of the analog output signal corresponding to a first level of the digital input data signal; activating a second switch to enable the DAC to output a second value of the analog output signal, in response to a transition of the digital input data signal from the first level to a second level, while continuing to activate the first switch for a half clock period of the clock signal after activating the second switch, causing the analog output signal to partially transition from the first value to the second value; and deactivating the first switch after the half clock period, causing the analog output signal to completely transition from the first value to the second value. The transition from the first value to the second value occurs in equal steps which each correspond to the half clock period of the clock signal. Also, activation of the first switch is not needed to enable the DAC to output the second value of the analog output signal, and activation of the second switch is not needed to enable the DAC to output the first value of the analog output signal.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features and/or components.

DETAILED DESCRIPTION

In the following detailed description, for purposes of explanation and not limitation, representative embodiments disclosing specific details are set forth in order to provide a thorough understanding of the present teachings. Descriptions of known devices, materials and manufacturing methods may be omitted so as to avoid obscuring the description of the example embodiments. Nonetheless, such devices, materials and methods that are within the purview of one of ordinary skill in the art may be used in accordance with the representative embodiments.

In view of this disclosure it is noted that the various DAC and DAC switch driver circuits may be implemented in variant structures and using variant components in keeping with the present teachings. Further, the various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

According to various embodiments, the fidelity with which a DAC can produce a desired continuous time sequence of output values is improved by effectively doubling the update rate and halving the step size of the DAC, without having to double the data rate of the digital input data signal or increase resolution of the digital input data signal. Generally, the embodiments are directed to DACs that use switches to connect multiple current sources to multiple outputs, such that at rest each current source is always connected to one output. This may include DACs having multiple current sources of equal or scaled weight, and switches that enable connection of each current source to one of two (or more) output terminals.

Figure 1:
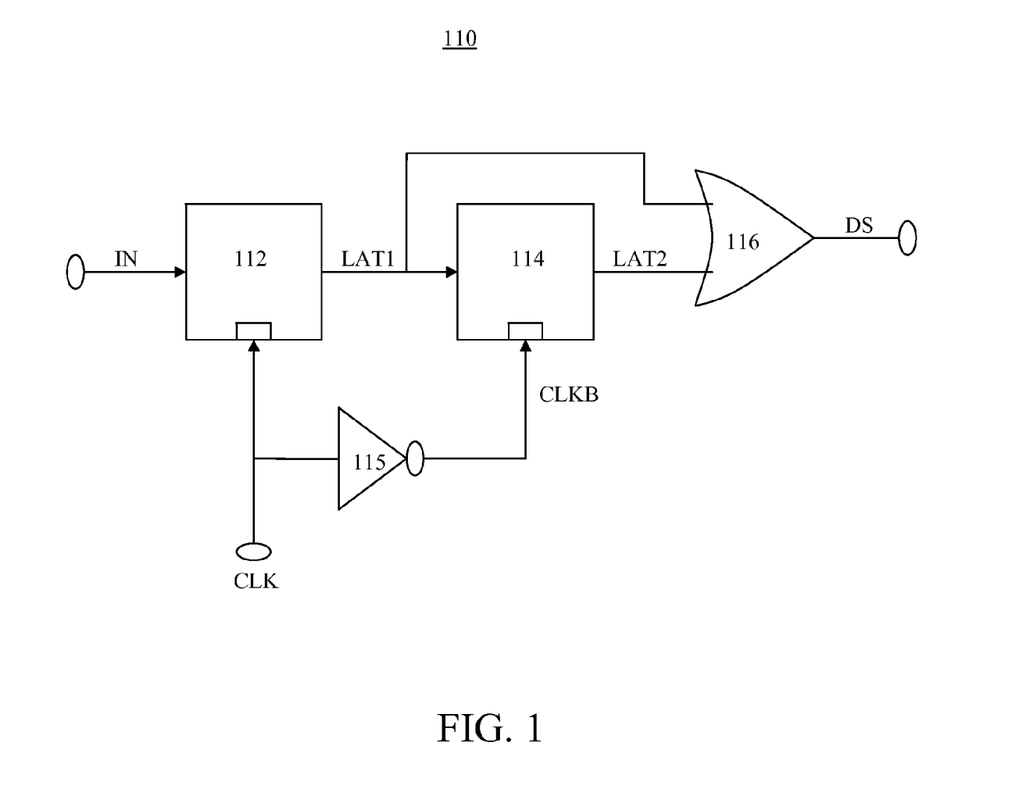
FIG. 1 is a simplified block diagram of a DAC switch driver, according to a representative embodiment.

FIG. 1 is a simplified block diagram of a DAC switch driver, according to a representative embodiment.

Referring to FIG. 1, DAC switch driver 110 includes first latch (master latch) 112 and second latch (slave latch) 114, which perform first and second latch operations, respectively. The first and second latches 112 and 114 may be included in a flip-flop, for example. The first latch 112 receives a digital input data signal IN from an external source, such as a DAC controller (not shown), stores the level of the digital input data signal IN, and outputs first latch signal LAT1. The level of the digital input data signal IN may be either high (data "1") or low (data "0"). The first latch 112 also receives clock signal CLK, and performs the first latch operation under control of the clock signal CLK. The second latch 114 receives the first latch signal LAT1 from the first latch 112, stores the level of the first latch signal LAT1, and outputs second latch signal LAT2. In addition, the second latch 114 receives a logical inverse of the clock signal CLK, indicated as inverse clock signal CLKB, obtained from inverter 115, which inverts the clock signal CLK. The second latch 114 performs the second latch operation under control of the inverse clock signal CLKB. For the purpose of this description, the first and second latches 112 and 114 are assumed to be level sensitive and transparent when their respective clock inputs are high, and latched when their respective clock inputs are low.

The DAC switch driver 110 further includes logic gate 116, which receives the first and second latch signals LAT1 and LAT2, and performs an OR logic operation. The logic gate 116 outputs the result of the OR logic operation as drive signal DS, used to drive a switch in a DAC (not shown), discussed below with reference to FIGS. 3 and 4. In other words, the drive signal DS is the first latch signal LAT1 output by the first latch 112 OR'ed with the second latch signal LAT2 output by the second latch 114. Accordingly, when the level of the digital input data signal IN changes from low to high, for example, the drive signal DS transitions to the high level at the next edge of the clock signal CLK that makes the first latch 112 transparent (i.e., the next occurring rising edge of the clock signal CLK in the present example). Then, when the level of the digital input data signal IN changes from high back to low, the drive signal DS transitions back to the low level at the next edge of the clock signal CLK that makes the second latch 114 transparent (i.e., the next occurring falling edge of the clock signal CLK, or the next occurring rising edge of the inverse clock signal CLKB, in this example) after the next edge of the clock signal CLK that makes the first latch 112 transparent. Of course, alternative configurations, such as providing the inverted clock signal CLKB to the first latch 112 and the clock signal CLK to the second latch 114, or the first and second latches 112 and 114 having opposite clock sensitivity driven by the same clock signal CLK, may result in level changes occurring at different edges of the clock signal CLK, without departing from the scope of the present teachings.

Figure 2:
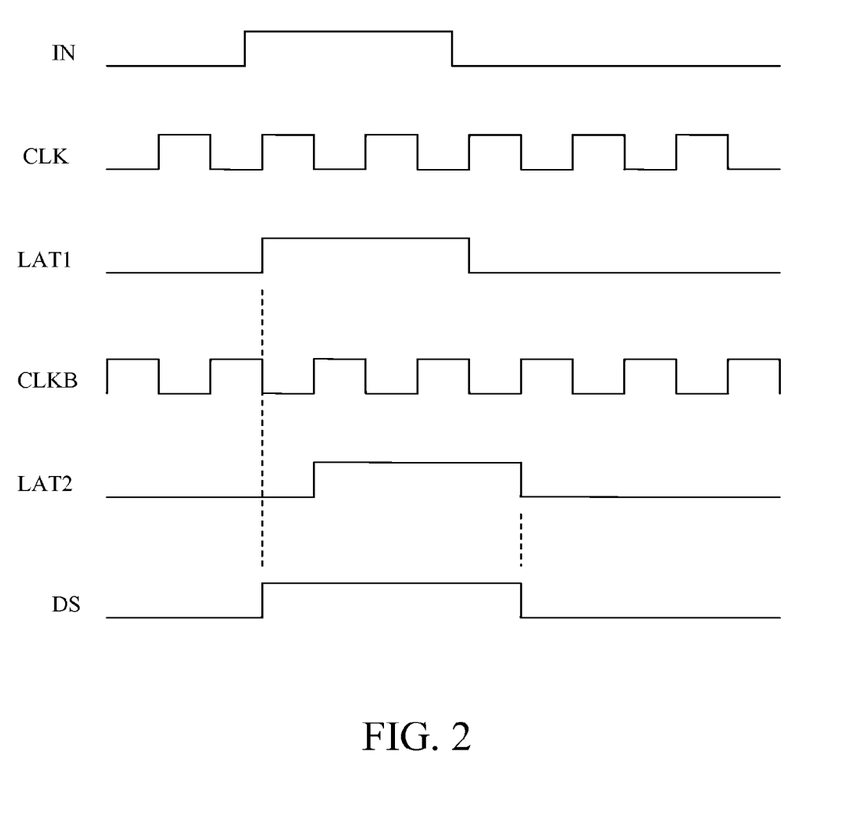
FIG. 2 is a timing diagram of signals generated during operation of the DAC switch driver shown in FIG. 1, according to a representative embodiment.

FIG. 2 is a timing diagram of signals generated during operation of the DAC switch driver shown in FIG. 1, according to a representative embodiment.

Referring to FIGS. 1 and 2, the first latch 112 receives clock signal CLK and illustrative digital input data signal IN, and outputs first latch signal LAT1. The first latch signal LAT1 transitions from the low level to the high level, in response to a transition of the digital input data signal IN from the low level to the high level, at the rising edge of the next clock period of the clock signal CLK, as shown in FIG. 2. The second latch 114 receives the inverse clock signal CLKB and the first latch signal LAT1, and outputs the second latch signal LAT2. The second latch signal LAT2 transitions from the low level to the high level, in response to the transition of the first latch signal LAT1 from the low level to the high level, at the rising edge of the next clock period of the inverse clock signal CLKB (which corresponds to the next falling edge of the clock signal CLK). Accordingly, the second latch signal LAT2 transitions to the high level a half clock period after the first latch signal LAT1 transitions to the high level.

Subsequently, the first latch signal LAT1 transitions from the high level to the low level, in response to the transition of the digital input data signal IN from the high level to the low level, at the rising edge of the next clock period of the clock signal CLK. The second latch signal LAT2 likewise transitions from the high level to the low level, in response to the transition of the first latch signal LAT1 from the high level to the low level, at the rising edge of the next clock period of the inverse clock signal CLKB. Accordingly, the second latch signal LAT2 transitions to the low level a half clock period after the first latch signal LAT1 transitions to the low level.

As discussed above, the logic gate 116 performs an OR logic operation on the first and second latch signals LAT1 and LAT2. Therefore, the drive signal DS is at the high level when one or both of the first and second latch signals LAT1 and LAT2 are at the high level. Thus, in the depicted example, the drive signal DS transitions to the high level when the first latch signal LAT1 first transitions to the high level, and subsequently transitions to the low level when the second latch signal LAT2 transitions to the low level, as indicated by dashed lines in FIG. 2. Accordingly, the drive signal DS remains at the high level for a half clock period longer than either the first latch signal LAT1 or the second latch signal LAT2. It follows that a switch being driven by the drive signal DS would remain activated (closed) for a half clock period longer than either the first latch signal LAT1 or the second latch signal LAT2, providing a transition to the next DAC level, as discussed below.

Figure 3:
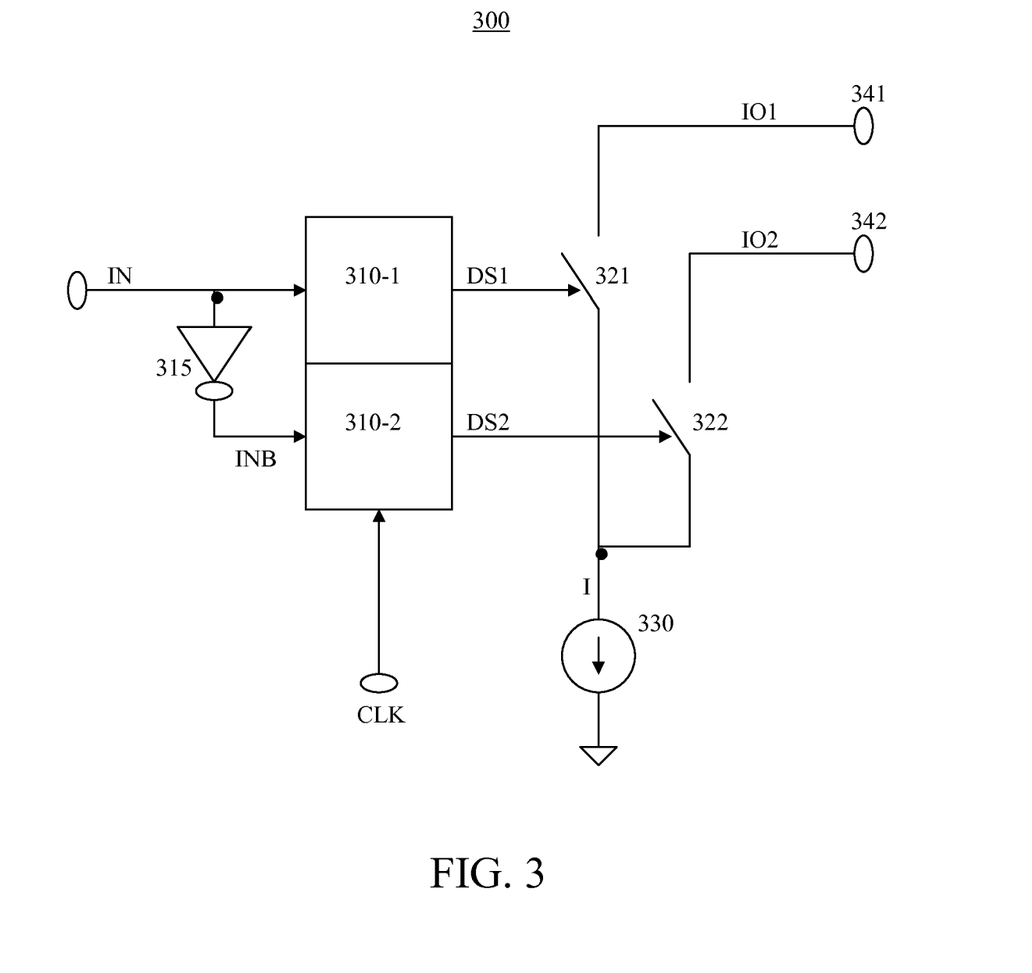
FIG. 3 is a simplified block diagram of a DAC, including the DAC switch driver of FIG. 1, according to a representative embodiment.

FIG. 3 is a simplified block diagram of a DAC, including the DAC switch driver of FIG. 1, according to a representative embodiment.

Referring to FIG. 3, DAC 300 is a one-bit DAC, and includes first DAC switch driver 310-1 and second DAC switch driver 310-2, each of which is substantially the same as the DAC switch driver 110 discussed above with reference to FIG. 1. The first DAC switch driver 310-1 receives digital input data signal IN and outputs first drive signal DS1. The second DAC switch driver 310-2 receives inverse digital input data signal INB, provided by inverter 315, and outputs second drive signal DS2.

The DAC 300 further includes first switch 321 and second switch 322. The first switch 321 is controlled by the first drive signal DS1 to selectively connect current source 330 with first DAC current output 341 for outputting first output current IO1. The second switch 322 is controlled by the second drive signal DS2 to selectively connect the current source 330 with second DAC current output 342 for outputting second output current IO2, where the first output current IO1 and the second output current IO2 are complementary signals in that the sum of the first output current IO1 and the second output current IO2 is constant and equal to the current I in the current source 330. In the depicted configuration, each of the first and second switches 321 and 322 is activated (closed) when the corresponding first and second drive signals DS1 and DS2 are at the high level, respectively, although alternative configurations may be implemented.

Figure 4:
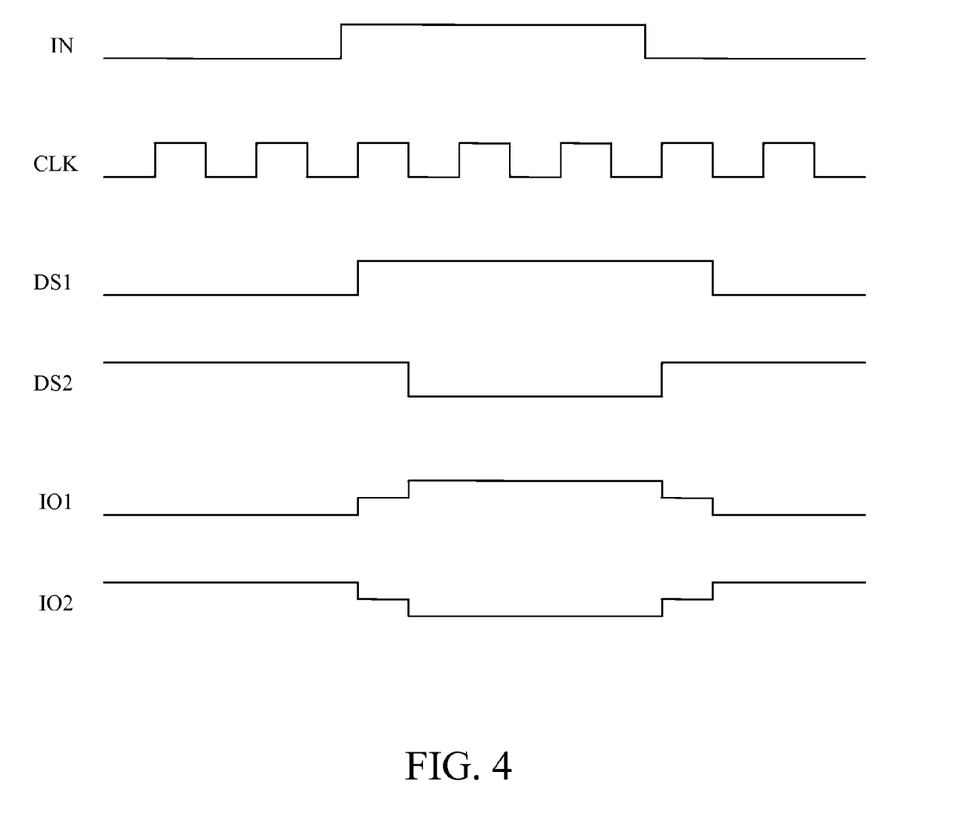
FIG. 4 is a timing diagram of signals generated during operation of the DAC shown in FIG. 3, according to a representative embodiment.

FIG. 4 is a timing diagram of signals generated during operation of the DAC shown in FIG. 3, according to a representative embodiment.

Referring to FIGS. 3 and 4, the first DAC switch driver 310-1 receives clock signal CLK and illustrative digital input data signal IN, and outputs first drive signal DS1. The second DAC switch driver 310-2 receives the clock signal CLK and inverse input data signal INB, and outputs second drive signal DS2. The first and second drive signals DS1 and DS2 are determined in substantially the same manner as the drive signal DS, as discussed above with reference to FIG. 1.

The first output current IO1 transitions between zero and the current I (full value) of the current source 330 in two steps. In particular, the first output current IO1 begins at zero when the first switch 321 is deactivated (opened), in response to the first drive signal DS1 being at the low level. When the first drive signal DS1 transitions to the high level, the first switch 321 is turned on, allowing half of the current I from the current source 330 to flow. The other half of the current I flows through the second switch 322, which is still on in response to the initial high level of the second drive signal DS2. Accordingly, the first output current IO1 transitions to an intermediate level of current I/2. Then, when the second drive signal DS2 transitions to the low level and the second switch 322 is deactivated (while the first switch 321 remains activated), the first output current IO1 completely transitions to the full value of current I of current source 330. The first output current IO1 transitions back to the low level in reverse order when the second switch 322 is activated and the first switch is subsequently deactivated in response to the first and second drive signals DS1 and DS2, respectively. The second output current IO2 similarly transitions between the full value of current I and zero in two complementary steps, as shown in FIG. 4.

Figure 5:
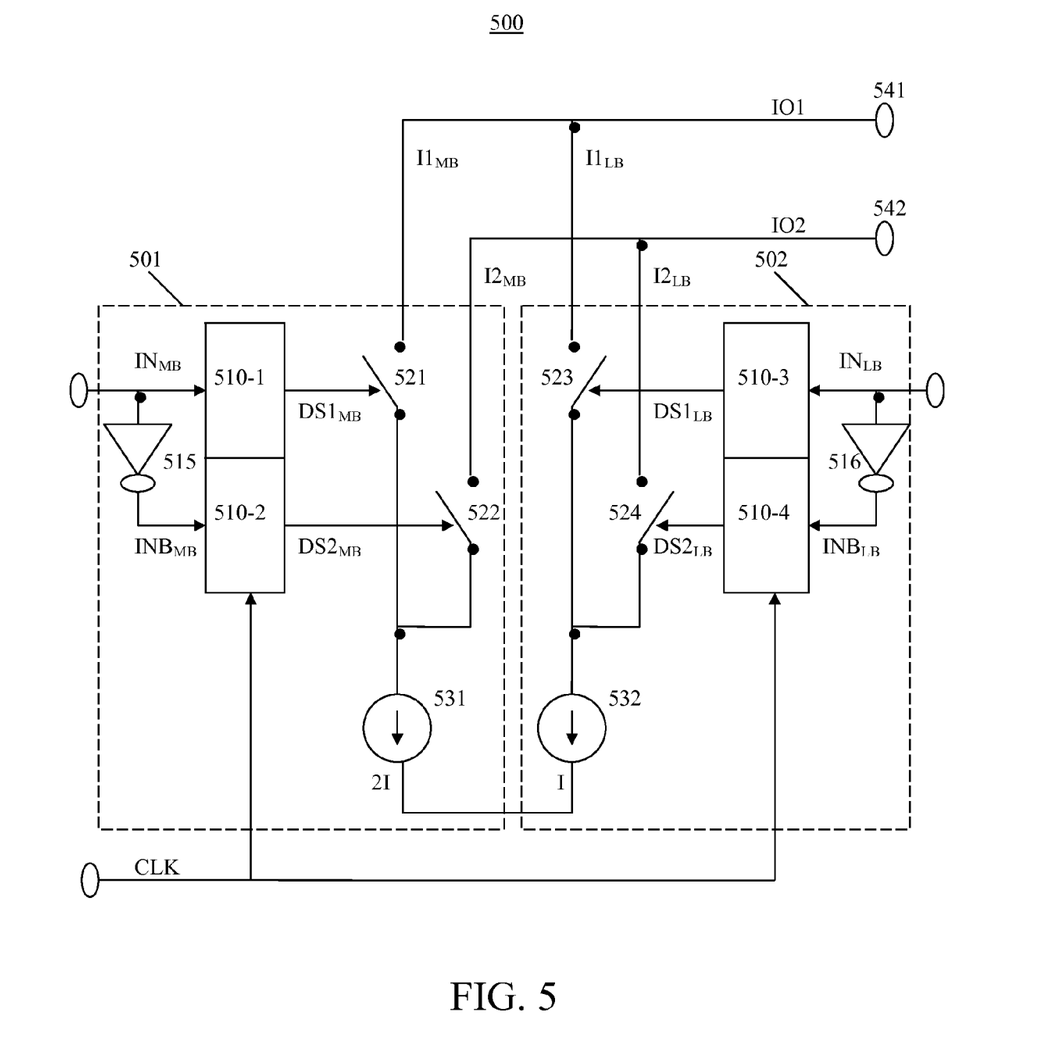
FIG. 5 is a simplified block diagram of a DAC, including the DAC switch driver of FIG. 1, according to a representative embodiment.

FIG. 5 is a simplified block diagram of a DAC, including the DAC switch driver of FIG. 1, according to another representative embodiment.

Referring to FIG. 5, DAC 500 is an example of a multi-bit DAC, which receives a multi-bit input data signal IN including at least a most significant bit (MSB) input data signal $IN_{MB}$ and a least significant bit (LSB) input data signal $IN_{LB}$. More particularly, the DAC 500 is a two-bit DAC, in which case the multi-bit input data signal IN consists entirely of the MSB input data signal $IN_{MB}$ and the LSB input data signal $IN_{LB}$.

The DAC 500 includes an MSB DAC circuit 501, which includes first DAC switch driver 510-1 and second DAC switch driver 510-2 for processing the MSB input data signal $IN_{MB}$, and an LSB DAC circuit 502, which includes third DAC switch driver 510-3 and fourth DAC switch driver 510-4 for processing the LSB input data signal $IN_{LB}$. Each of the first DAC switch driver 510-1, the second DAC switch driver 510-2, the third DAC switch driver 510-3 and the fourth DAC switch driver 510-4 is substantially the same as the DAC switch driver 110 discussed above with reference to FIG. 1.

More particularly, in the MSB DAC circuit 501, the first DAC switch driver 510-1 receives the MSB input data signal $IN_{MB}$ and outputs first MSB drive signal $DS1_{MB}$. The second DAC switch driver 510-2 receives inverse MSB input data signal $INB_{LB}$, provided by inverter 515, and outputs second MSB drive signal $DS2_{MB}$. The MSB DAC circuit 501 further includes first switch 521 and second switch 522. The first MSB drive signal $DS1_{MB}$ controls the first switch 521 to selectively connect first current source 531 with first DAC current output 541 for outputting first output current IO1. Likewise, the second MSB drive signal $DS2_{MB}$ controls the second switch 522 to selectively connect the first current source 531 with the second DAC current output 542 for outputting second output current IO2. In the depicted embodiment, the first current source 531 in the MSB DAC circuit 501 provides twice the current (2I) as second current (I) from second current source 532 in the LSB DAC circuit 502, discussed below. For purposes of explanation, the current I is referred to as the "unit current" in the following description. Also, in the depicted illustrative configuration, each of the first and second switches 521 and 522 is activated (closed) when the corresponding first and second drive signals $DS1_{MB}$ and $DS2_{MB}$ are at the high level, respectively, although alternative configurations may be implemented.

Similarly, in the LSB DAC circuit 502, the third DAC switch driver 510-3 receives the LSB input data signal $IN_{LB}$ and outputs first LSB drive signal $DS1_{LB}$. The fourth DAC switch driver 510-4 receives inverse LSB input data signal $INB_{LB}$, provided by inverter 516, and outputs second LSB drive signal $DS2_{LB}$. The LSB DAC circuit 502 further includes third switch 523 and fourth switch 524. The first LSB drive signal $DS1_{LB}$ controls the third switch 523 to selectively connect the second current source 532 with the first DAC current output 541 for outputting the first output current IO1. Likewise, the second LSB drive signal $DS2_{LB}$ controls the second switch 522 to selectively connect the second current source 532 with the second DAC current output 542 for outputting the second output current IO2. In the depicted configuration, each of the third and fourth switches 523 and 524 is activated when the corresponding first and second drive signals $DS1_{LB}$ and $DS2_{LB}$ are at the high level, respectively, although alternative configurations may be implemented.

Figure 6:
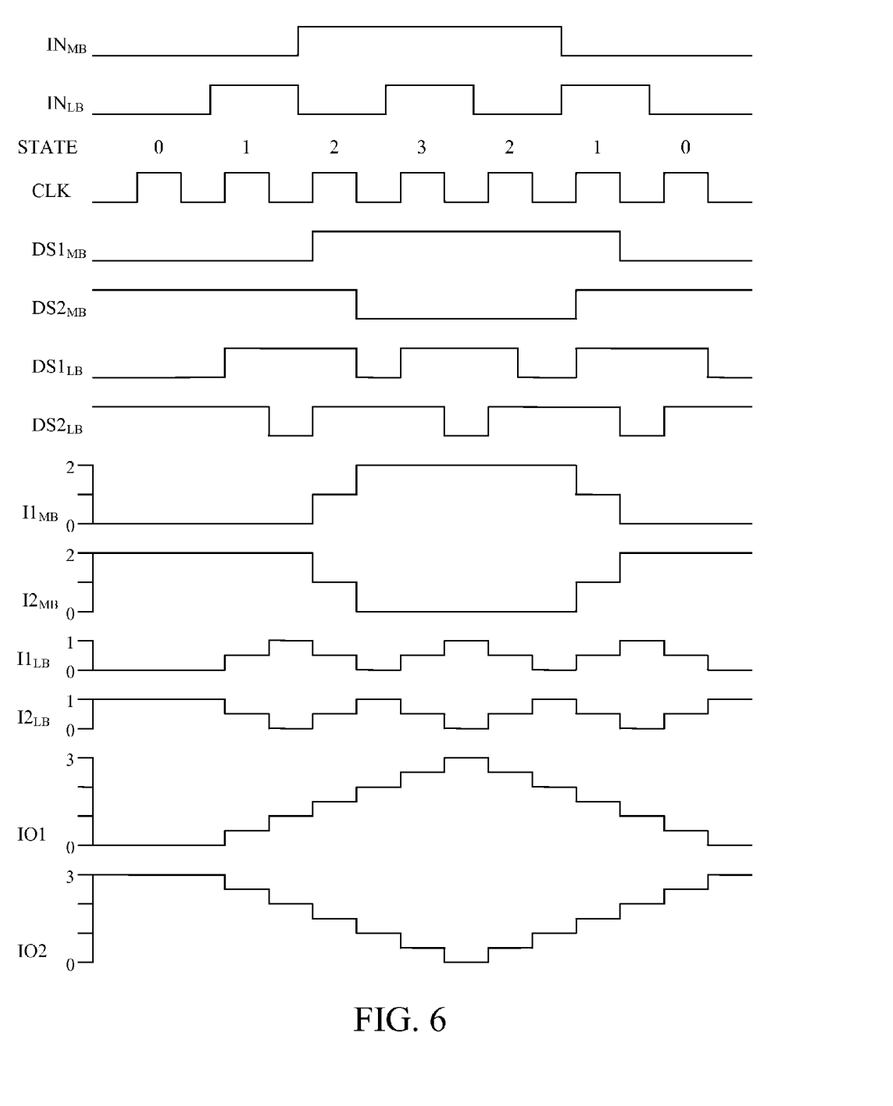
FIG. 6 is a timing diagram of signals generated during operation of the DAC shown in FIG. 5, according to a representative embodiment.

FIG. 6 is a timing diagram of signals generated during operation of the DAC shown in FIG. 5, according to a representative embodiment.

Referring to FIGS. 5 and 6, the first DAC switch driver 510-1 receives clock signal CLK and illustrative MSB input data signal $IN_{MB}$, and outputs first MSB drive signal $DS1_{MB}$. The second DAC switch driver 510-2 receives the clock signal CLK and inverse MSB input data signal $INB_{MB}$, and outputs second MSB drive signal $DS2_{MB}$. The third DAC switch driver 510-3 receives the clock signal CLK and illustrative LSB input data signal $IN_{LB}$, and outputs first LSB drive signal $DS1_{LB}$. The fourth DAC switch driver 510-4 receives the clock signal CLK and the inverse LSB input data signal $INB_{LB}$, and outputs second LSB drive signal $DS2_{LB}$. The first and second MSB drive signals $DS1_{MB}$ and $DS2_{MB}$, and the first and second LSB drive signals $DS1_{LB}$ and $DS2_{LB}$, are determined in substantially the same manner as the drive signal DS, as discussed above with reference to FIG. 1. In FIG. 6, STATE shows the number (in decimal) indicated by the MSB input data signal $IN_{MB}$ and the LSB input data signal $IN_{LB}$. That is, STATE is the numerical sum of the MSB input data signal $IN_{MB}$ and the LSB input data signal $IN_{LB}$ if the MSB input data signal $IN_{MB}$ is given a weight of two and the LSB input data signal $IN_{LB}$ is given a weight of one, e.g., assuming that together they form a two-bit binary number.

In the depicted embodiment, the MSB DAC circuit 501 provides a first MSB current $I1_{MB}$ and a second MSB current $I2_{MB}$, while the LSB DAC circuit 502 provides a first LSB current $I1_{LB}$ and a second LSB current $I2_{LB}$. Therefore, the first output current IO1 of the DAC 500 is the sum of the first MSB current $I1_{MB}$ and the first LSB current $I1_{LB}$ (IO1=$I1_{MB}$+$I1_{LB}$), and the second output current IO2 of the DAC 500 is the sum of the second MSB current $I2_{MB}$ and the second LSB current $I2_{LB}$ (IO2=$I2_{MB}$+$I2_{LB}$).

The first MSB current $I1_{MB}$ transitions between zero and double the unit current I in two steps. More particularly, in the depicted example, the first MSB current $I1_{MB}$ begins at zero (data "0") when the first switch 521 is deactivated (opened), in response to the first MSB drive signal $DS1_{MB}$ being at the low level. When the first MSB drive signal $DS1_{MB}$ transitions to the high level, the first switch 521 is turned on, allowing half of the current 2I from the first current source 531 to flow. The other half of the current 2I flows through the second switch 522, which is still activated in response to the initial high level of the second MSB drive signal $DS2_{MB}$. Accordingly, the first MSB current $I1_{MB}$ transitions to a level of one unit current I (data "1"). Then, when the second MSB drive signal $DS2_{MB}$ transitions to the low level and the second switch 522 is deactivated (while the first switch 521 remains activated), the first MSB current $I1_{MB}$ transitions to a level of two unit currents 2I (data "2"). The first MSB current $I1_{MB}$ transitions back to zero (data "0") in reverse order when the second switch 522 is activated and the first switch 521 is subsequently deactivated in response to the first and second MSB drive signals $DS1_{MB}$ and $DS2_{MB}$, respectively. The second MSB current $I2_{MB}$ similarly transitions between two unit currents 2I (data "2") and zero (data "0") in multiple complementary steps, as shown in FIG. 6.

Meanwhile, the first LSB current $I1_{LB}$ transitions between zero and one unit current I in two steps. More particularly, in the depicted example, the first LSB current $I1_{LB}$ begins at zero (data "0") when the third switch 523 is deactivated, in response to the first LSB drive signal $DS1_{LB}$ being at the low level. When the first LSB drive signal $DS1_{LB}$ transitions to the high level, the third switch 523 is turned on, allowing half of the unit current I from the second current source 532 to flow. The other half of the unit current I flows through the fourth switch 524, which is still activated in response to the initial high level of the second LSB drive signal $DS2_{LB}$. Accordingly, the first LSB current $I1_{LB}$ transitions to an intermediate level half way between zero and the level of one unit current I. Then, when the second LSB drive signal $DS2_{LB}$ transitions to zero and the fourth switch 524 is deactivated (while the third switch 523 remains activated), the first LSB current $I1_{LB}$ transitions to the level of one unit current I (data "1"). The first LSB current $I1_{LB}$ transitions back to the low level (data "0") in reverse order when the fourth switch 524 is activated and the third switch 523 is subsequently deactivated in response to the first and second LSB drive signals $DS1_{LB}$ and $DS2_{LB}$, respectively. The second LSB current $I2_{LB}$ similarly transitions between the level of one unit current I (data "1") and zero (data "0") in multiple complementary steps, as shown in FIG. 6.

Accordingly, the first output current IO1 transitions between a low level (data "0") and a high level equal to the sum of the currents in current sources 531 and 532, namely three unit currents 3I (data "3") in multiple steps, by combining the first MSB output current $I1_{MB}$ and the first LSB output current $I1_{LB}$ every half clock period of the clock signal CLK. That is, the first output current IO1 increases in increments of a half step between the zero (data "0") and the three unit currents 3I (data "3"), and subsequently decreases in increments of a half step between the three unit currents 3I (data "3") and the zero (data "0"), each half clock period by operation of the first through fourth switches 521 to 524 in response to transitions in the MSB input data signal $IN_{MB}$ and the LSB input data signal $IN_{LB}$, discussed above. Likewise, the second output current IO2 similarly transitions between three unit currents 3I (data "3") to zero (data "0") in multiple steps, by combining the second MSB output current $I2_{MB}$ and the second LSB output current $I2_{LB}$ every half clock period of the clock signal CLK in multiple complementary steps, as shown in FIG. 6.

Notably, in the depicted example, the digital input data signal IN transitions in single units (e.g., 0, 1, 2, 3, 2, 1, 0), for purposes of explanation. Therefore, as shown in FIG. 6, each intermediate step in the first and second output currents IO1 and IO2, which occurs at the half clock cycle and is halfway between the beginning and ending values of consecutive input data signals, is one-half unit current I. This results in the first and second output currents IO1 and IO2 having uniform, stair-step appearances. However, it is understood that the digital input data signal IN may transition in multiple units (e.g., 0, 3, 1), although the intermediate step occurring at the half clock cycle is still halfway between the beginning and ending values of the consecutive input data signals. For example, when the digital input data signal IN transitions from 0 to 3, the intermediate step occurring at the half clock cycle is one and a half unit current I, and when the digital input data signal IN transitions from 3 to 1, the intermediate step occurring at the half clock cycle is one unit current I. In other words, independent of how many bits are in the digital input data signal IN, of how many switch drivers and switches the DAC has, and of how large the difference is between consecutive values of the digital input signal IN, the DAC 500, according to the various embodiments interposes one additional step halfway between the corresponding consecutive first and second (analog) output currents IO1 and IO2.

Of course, various alternative embodiments may include multi-bit DACs configured to receive and process multi-bit input data signals IN having more than two-bits, without departing from the scope of the present teachings. In such embodiments, the multi-bit DAC would be configured to process at least the MSB input data signal $IN_{MB}$ and the LSB input data signal $IN_{LB}$, as described above, as well as one or more additional (intermediate) bits in substantially the same manner. For example, a three-bit input data signal IN would include one additional DAC circuit (e.g., in addition to the MSB DAC circuit 501 and the LSB DAC circuit 502), which would include a corresponding pair of DAC switch drivers, an inverter and a current source. In a binary-weighted three-bit DAC, the current source of the additional DAC circuit would output an intermediate current, e.g., such that the current source of the LSB DAC circuit (e.g., 502) would provide unit current I, the current source of the additional DAC circuit would provide two unit currents 2I, and the current source of the MSB DAC circuit (e.g., 501) would provide four unit currents 4I. Otherwise, the three-bit DAC would operate in substantially the same manner discussed above with respect to the DAC 500 to produce complementary first and second output currents IO1 and IO2. That is, the first output current IO1 would be the sum of a first MSB current $I1_{MB}$, a first intermediate current (output by the additional DAC circuit) and a first LSB current $I1_{LB}$, and the second output current IO2 would be the sum of a second MSB current $I2_{MB}$, a second intermediate current (output by the additional DAC circuit) and a second LSB current $I2_{LB}$, as would be apparent to one of ordinary skill in the art based on the previous description.

In addition, there may be multiple configurations for the relative sizes of the current sources (e.g., the first and second current sources 531 and 532). With respect to the illustrative configuration shown in FIG. 5, the DAC 500 may be referred to as a "segmented DAC," in which the current source(s) for the MSB(s) is/are split into equal segments. For example, a segmented three-bit DAC would have four current sources having respective current magnitudes of I, 2I, 2I and 2I, reducing the requirements for the precision of the MSB current source(s). Alternatively, in a "binary weighted DAC," the current sources are scaled by powers of two. Therefore, a three-bit DAC, for example, would have current sources having respective current magnitudes of I, 2I and 4I. In a "thermometer DAC," the current sources are all equal. Therefore, a three-bit DAC, for example, would have seven equal current sources each having a current magnitude of I.

Figure 7:
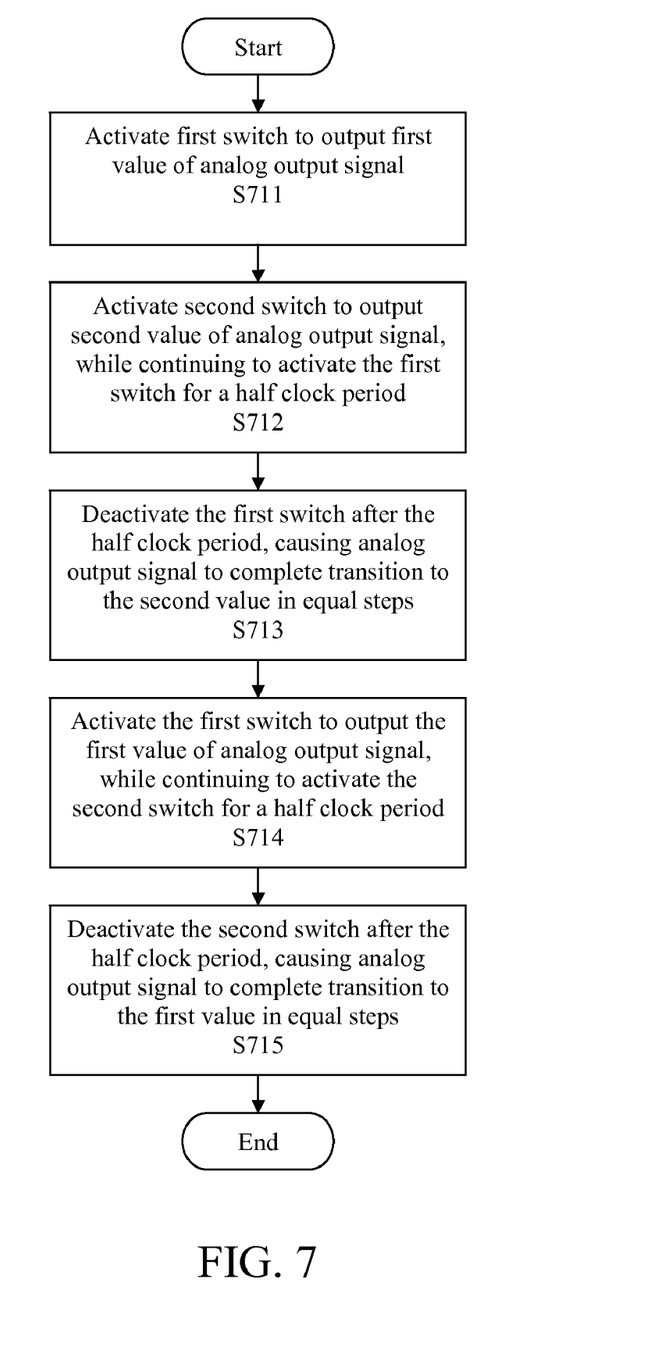
FIG. 7 is a flow diagram of a method for driving a DAC, according to representative embodiments.

FIG. 7 is a flow diagram of a method for driving a DAC, according to representative embodiments. The method may be performed by a DAC, such as DAC 300 shown in FIG. 3 or DAC 500 shown in FIG. 5, for example, that receives a digital input data signal and outputs a corresponding analog output signal. As discussed above, the DAC includes multiple switch drivers that generate corresponding drive signals for controlling multiple switches, respectively. The switches selectively connect at least one current source to at least one output of the DAC in response to the drive signals under control of a clock signal.

Referring to FIG. 7, at least one first switch of the DAC is activated in block S711 to enable the DAC to output a first value of the analog output signal corresponding to a first level of the digital input data signal. For example, the first level of the digital input data signal may be a low level (data "0"). It is assumed that at least one second switch of the DAC, which need not be activated for the DAC to output the first value of the analog output signal, is maintained in a deactivated (open) state while the at least one first switch is activated.

In block S712, the at least one second switch is activated to enable the DAC to output a second value of the analog output signal, in response to a transition of the digital input data signal from the first level to a second level. For example, the second level of the digital input data signal may be a high level (data "1"). Meanwhile, the at least one first switch continues to be maintained in the activated (closed) state, even though the at least one first switch is not needed to enable the DAC to output the second value. For example, the at least one first switch is maintained in the activated state for a half clock period of the clock signal. While both the at least one first switch and the at least one second switch are activated, they share the current of the current source substantially equally and therefore the analog output signal of the DAC transitions from the first value half way to the second value.

Then, a half clock period after the at least one second switch is activated in block S712, the at least one first switch is deactivated in block S713, causing the DAC to complete the transition from the first value to the second value. Therefore, in blocks S711-S713, the analog output signal of the DAC transitions from the first value to the second value, in response to the digital input data signal transitioning from the first level to the second level, in two equal steps. Each step corresponds in time to a half clock period of the clock signal and corresponds in value to one half of the difference between the first and second values of the analog output signal.

In blocks S714 and S715, the analog output signal transitions from the second value back to the first value. In particular, in block S714, the at least one first switch is activated to enable the DAC to output the first value of the analog output signal, in response to a transition of the digital input data signal from the second level to the first level. Meanwhile, the at least one second switch initially continues to be maintained in the activated (closed) state, even though the at least one second switch is not needed to enable the DAC to output the second value, for a half clock period of the clock signal. While both the at least one first switch and the at least one second switch are activated, they again share the current equally and therefore the analog output signal of the DAC transitions from the second value half way to the first value.

Then, a half clock period after the at least one first switch is activated in block S714, the at least one second switch is deactivated in block S715, causing the DAC to complete the transition from the second value to the first value. Therefore, in blocks S714-S715, the analog output signal of the DAC transitions from the second value back to the first value, in response to the digital input data signal transitioning from the second level to the first level, in two equal steps. Again, each step corresponds in time to a half clock period of the clock signal and corresponds in value to one half of the difference between the first and second values of the analog output signal.

Generally, according to various embodiments, one or more switches are closed on one edge (e.g., rising edge) of the clock signal CLK, and opened on the opposite edge (e.g., falling edge). Therefore, when the value of the analog output signal of the DAC needs to change, the switches needed to provide the new value activate (close). However, the switches closed to begin with but not needed to provide the new value do not immediately deactivate (open), but rather remain closed for half of a clock period of the clock signal. As a result, the output value of the DAC becomes the average of the old value and the new value for this half of the clock period. Switch on-impedances are chosen to be equal such that the currents that need to be switched from one output to another will be shared equally by the two outputs of the DAC. In this way, the transition from the old value to the new value of the analog output signal occurs in two equal steps, separated in time by half a clock period and separated in output value by half the difference between old value and the new value. Yet, the data source that provides the digital input data signal need only provide signal levels corresponding to the old value and new value, separated by full clock periods. In other words, there are no additional demands on clock speed or width of the system data path, for example.

For DACs with two (differential) outputs, the various embodiments require additional hardware, as compared to conventional DACs, since separate switch drivers are needed for each switch (e.g., instead of a single switch driver with two complementary outputs driving two switches). However, for DACs with more than two outputs, separate switch drivers for each switch are needed anyway. For high-performance DACs, the switch drivers may have built-in latches or flip-flops, which may be configured to implement the various embodiments.

While specific embodiments are disclosed herein, many variations are possible, which remain within the concept and scope of the invention. Such variations would become clear after inspection of the specification, drawings and claims herein. The invention therefore is not to be restricted except within the scope of the appended claims.

The invention claimed is:

1. A device for driving a switch in a digital-to-analog converter (DAC), the device comprising:
 a first latch configured to store a digital input data signal according to a clock signal, and to output a first latch signal corresponding to the stored digital input data signal;
 a second latch configured to store the first latch signal output by the first latch according to a logical inverse of the clock signal, and to output a second latch signal corresponding to the stored first latch signal; and
 a logic gate configured to perform an OR logic operation on the first latch signal and the second latch signal, the logic gate outputting a drive signal for driving a switch in the DAC connected to a current source.

2. The device of claim 1, wherein the first latch signal transitions from a first level to a second level at a first edge of a first clock period of the clock signal, corresponding to the digital input data signal transitioning from the first level to the second level, and
 wherein the second latch signal transitions from the first level to the second level at a second edge of the first clock period of the clock signal, the second edge occurring a half clock period after the first edge.

3. The device of claim 2, wherein the first latch signal transitions from the second level back to the first level at a first edge of a second clock period of the clock signal, corresponding to the digital input data signal transitioning from the second level back to the first level, and
 wherein the second latch signal transitions from the second level back to the first level at a second edge of the second clock period of the clock signal, the second edge occurring a half clock period after the first edge.

4. The device of claim 3, wherein the drive signal transitions from the first level to the second level at the first edge of the first clock period of the clock signal, and transitions from the second level back to the first level at the second edge of the second clock period.

5. The device of claim 4, wherein the first level is a low level and the second level is a high level, the first edge of each of the first and second clock periods is a rising edge, and the second edge of each of the first and second clock periods is a falling edge.

6. The device of claim 1, wherein the drive signal transitions from a first level to a second level, in response to the digital input data signal transitioning from the first level to the second level, at a next edge of the clock signal that makes the first latch transparent.

7. The device of claim 6, wherein the drive signal transitions from the second level back to the first level, in response to the digital input data signal transitioning from the second level back to the first level, at a next edge of the clock signal that makes the second latch transparent.

8. A digital-to-analog converter (DAC), comprising:
 a plurality of switch drivers configured to receive a digital input data signal and an inverse of the digital input data signal, respectively, and to output a corresponding plurality of drive signals;
 a plurality of switches corresponding to the plurality of switch drivers and operable in response to the plurality of drive signals; and
 at least one current source selectively connectable to a plurality of outputs by the plurality of switches, respectively, the plurality of outputs providing a corresponding plurality of analog output signals,
 wherein each of the plurality of switch drivers comprises:
  a master latch configured to latch a level of one of the digital input data signal or the inverse of the digital input data signal according to a clock signal, and to output a master latch signal;
  a slave latch configured to latch a level of the master latch signal output by the master latch according to an inverse of the clock signal, and to output a slave latch signal; and
  a logic gate configured to perform an OR logic operation on the master latch signal and the slave latch signal, the logic gate outputting one of the plurality of drive signals for driving a corresponding switch of the plurality of switches.

9. The DAC of claim 8, wherein the plurality of outputs comprise first and second outputs that provide complementary analog output signals corresponding to the digital input data signal.

10. The DAC of claim 9, wherein the digital input data signal comprises one-bit data.

11. The DAC of claim 10, wherein the plurality of switch drivers comprise a first switch driver configured to receive the digital input data signal and to output a first drive signal for driving a first switch, and a second switch driver configured to receive the inverse of the digital input data signal and to output a second drive signal for driving a second switch.

12. The DAC of claim 11, wherein the first switch selectively connects a first current source to the first output in response to the first drive signal, and second switch selectively connects the first current source to the second output in response to the second drive signal.

13. The DAC of claim 9, wherein the digital input data signal comprises multi-bit data, including at least a most significant bit (MSB) digital input data signal and a least significant bit (LSB) digital input data signal.

14. The DAC of claim 13, wherein the plurality of switch drivers comprise a first switch driver configured to receive the MSB digital input data signal and to output a first drive signal for driving a first switch, and a second switch driver configured to receive the inverse of the MSB digital input data signal and to output a second drive signal for driving a second switch.

15. The DAC of claim 14, wherein the plurality of switch drivers further comprise a third switch driver configured to receive the LSB digital input data signal and to output a third drive signal for driving a third switch, and a fourth switch driver configured to receive the inverse of the LSB digital input data signal and to output a fourth drive signal for driving a fourth switch.

16. The DAC of claim 15, wherein the first switch selectively connects a first current source to the first output in response to the first drive signal, and the second switch selectively connects the first current source to the second output in response to the second drive signal, and
 wherein the third switch selectively connects a second current source to the first output in response to the third drive signal, and the fourth switch selectively connects the second current source to the second output in response to the fourth drive signal.

17. The DAC of claim 16, wherein a first current provided by the first current source is a multiple of a magnitude of a second current provided by the second current source.

18. The DAC of claim 16, wherein a first current provided by the first current source has the same magnitude as a second current provided by the second current source.

19. A method of driving a digital-to-analog converter (DAC) that receives a digital input data signal and outputs corresponding analog output signal, the DAC comprising a plurality of switch drivers and a corresponding plurality of switches for selectively connecting at least one current source to at least one output of the DAC, in response to a plurality of drive signals provided by the plurality of switch drivers under control of a clock signal, the method comprising:

- activating a first switch to enable the DAC to output a first value of the analog output signal corresponding to a first level of the digital input data signal;
- activating a second switch to enable the DAC to output a second value of the analog output signal, in response to a transition of the digital input data signal from the first level to a second level, while continuing to activate the first switch for a half clock period of the clock signal after activating the second switch, causing the analog output signal to partially transition from the first value to the second value; and
- deactivating the first switch after the half clock period, causing the analog output signal to completely transition from the first value to the second value, wherein the transition from the first value to the second value occurs in equal steps which each correspond to the half clock period of the clock signal,
- wherein activation of the first switch is not needed to enable the DAC to output the second value of the analog output signal, and activation of the second switch is not needed to enable the DAC to output the first value of the analog output signal.

20. The method of claim 19, wherein each equal step further corresponds to half the difference between the first value and the second value of the analog output signal.

* * * * *